United States Patent
Avachat et al.

(10) Patent No.: US 8,927,322 B2
(45) Date of Patent: Jan. 6, 2015

(54) COMBINATORIAL METHODS FOR MAKING CIGS SOLAR CELLS

(75) Inventors: Upendra Avachat, Sunnyvale, CA (US); Tony Chiang, Campbell, CA (US); Craig Hunter, Los Gatos, CA (US); Jian Li, Fremont, CA (US); Guizhen Zhang, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 201 days.

(21) Appl. No.: 13/696,635

(22) PCT Filed: May 3, 2011

(86) PCT No.: PCT/US2011/035034
§ 371 (c)(1),
(2), (4) Date: Jul. 2, 2013

(87) PCT Pub. No.: WO2011/140115
PCT Pub. Date: Nov. 10, 2011

(65) Prior Publication Data
US 2013/0280853 A1    Oct. 24, 2013

Related U.S. Application Data

(60) Provisional application No. 61/331,347, filed on May 4, 2010.

(51) Int. Cl.
| | | |
|---|---|---|
| H01L 21/00 | (2006.01) | |
| H01L 31/05 | (2014.01) | |
| C23C 14/06 | (2006.01) | |
| C23C 14/16 | (2006.01) | |
| C23C 14/34 | (2006.01) | |
| C23C 14/58 | (2006.01) | |
| H01L 27/142 | (2014.01) | |
| H01L 31/032 | (2006.01) | |
| H01L 21/02 | (2006.01) | |

(52) U.S. Cl.
CPC ........ *H01L 31/0516* (2013.01); *C23C 14/0623* (2013.01); *C23C 14/165* (2013.01); *C23C 14/3464* (2013.01); *C23C 14/5866* (2013.01); *H01L 27/1423* (2013.01); *H01L 31/0322* (2013.01); *H01L 31/0326* (2013.01); *H01L 21/02568* (2013.01); *H01L 21/02614* (2013.01); *H01L 21/02631* (2013.01); *Y02E 10/541* (2013.01)
USPC .................... 438/80; 438/84; 438/85; 438/86

(58) Field of Classification Search
CPC ... H01L 31/18; H01L 31/042; H01L 31/0264; H01L 31/0272; H01L 31/0322; H01L 31/0326
USPC .......................... 438/80, 84, 85, 86; 257/443
See application file for complete search history.

(56) References Cited

U.S. PATENT DOCUMENTS

7,439,091 B2 * 10/2008 Chen et al. ..................... 438/32
7,544,574 B2    6/2009 Chiang et al.
(Continued)

*Primary Examiner* — Karen Kusumakar

(57) ABSTRACT

The present disclosure is directed to methods of forming different types of $Cu_2ZnSnS_4$ (CZTS) solar cells and Copper Indium Gallium DiSelenide (CIGS) solar cells that can be combinatorially varied and evaluated. These methodologies all incorporate the formation of site-isolated regions using a combinatorial processing tool and the use of these site-isolated regions to form the solar cell area. Therefore, multiple solar cells may be rapidly formed on a single substrate for use in combinatorial methodologies. Any of the individual processes of the methods described may be varied combinatorially to test varied process conditions or materials.

21 Claims, 11 Drawing Sheets a b

(56) References Cited

U.S. PATENT DOCUMENTS

| | | | |
|---|---|---|---|
| 7,687,871 B2* | 3/2010 | Maimon | 257/441 |
| 8,053,029 B2 | 11/2011 | Shim et al. | |
| 8,354,294 B2* | 1/2013 | de Rochemont et al. | 438/66 |
| 2007/0082487 A1* | 4/2007 | Chiang et al. | 438/687 |
| 2008/0110495 A1* | 5/2008 | Onodera et al. | 136/256 |
| 2009/0288702 A1 | 11/2009 | Kim et al. | |
| 2010/0055826 A1* | 3/2010 | Zhong et al. | 438/84 |

\* cited by examiner

COMBINATORIAL METHODS FOR MAKING CIGS SOLAR CELLS

CROSS REFERENCE TO RELATED APPLICATIONS

The present application claims the benefit under 35 U.S.C. §119(e) of U.S. Provisional Application Ser. No. 61/331,347, filed May 4, 2010, which is incorporated by reference in its entirety.

FIELD OF THE INVENTION

The present invention relates generally to semiconductor processing. More specifically, methods of forming $Cu_2ZnSnS_4$ (CZTS) solar cells and Copper Indium Gallium Selenide (CIGS) solar cells using combinatorial methodologies and the test substrates formed are described.

BACKGROUND OF THE INVENTION

Combinatorial processing has been used to evaluate materials, processes, and devices formed in semiconductor processing as well as other industries such as batteries, catalysts, pharmaceuticals, and biotechnology. Significant efforts to apply combinatorial processing to solar applications have not been made.

Solar cells have been widely researched as clean renewable energy sources are needed. Currently, mono and multi-crystalline silicon solar cells are the dominant technologies in the market. Mono and multi-crystalline silicon solar cells require a thick layer of silicon to efficiently absorb sun light. This determines the low material utilization rate for crystalline silicon solar cells, hence the difficulties of achieving low cost electricity. Thin film solar cells, on the other hand, require a very thin layer of absorber material due to their inherent material properties to efficiently convert sunlight directly to electricity. Amorphous/microcrystalline silicon (Si), cadmium telluride (CdTe) and copper indium gallium selenide (CIGS) are three leading materials used in thin film solar cells that are currently in production. Among these three thin film solar cells, CIGS has the best lab cell efficiency (close to 20%) and the best large area module efficiency (>12%).

In particular, development of solar cell test substrates using vacuum processing tools for the combinatorial evaluation of copper-zinc-tin-sulfide ($Cu_2ZnSnS_4$) (CZTS) solar cells and CIGS solar cells has not been done. Improvements, whether in materials, unit processes, or process sequences, are continually being sought for the solar cells. However, solar companies conduct research and development (R&D) on full substrate processing. This approach has resulted in escalating R&D costs and the inability to conduct extensive experimentation in a timely and cost effective manner.

The increasing demand for environmentally friendly, sustainable and renewable energy sources is driving the development of large area, thin film (TF) photovoltaic (PV) devices. With a long-term goal of providing a significant percentage of global energy demand, there is a concomitant need for Earth-abundant, high conversion efficiency materials for use in photovoltaic devices. A number of Earth abundant direct-bandgap semiconductor materials now seem to show evidence of the potential for both high efficiency and low cost in Very Large Scale (VLS) production (e.g. greater than 100 gigawatt (GW)), yet relatively little attention has been devoted to their development and characterization.

Among all thin film PV technologies, CIGS and CdTe are the only two materials that have reached volume production with greater than 10% stabilized module efficiencies. Solar cell production volume must increase tremendously in the coming decades to meet sharply growing energy needs that are expected to double to 27 terawatts (TW) in 2050. However, the supply of indium (In), gallium (GA) and tellurium (Te) may inhibit annual production of CIGS and CdTe solar panels. Moreover, price increases and supply constraints in indium and gallium could result from the aggregate demand for these materials used in flat panel displays (FPD) and light-emitting diodes (LED) along with CIGS PV. Efforts to develop devices that leverage manufacturing and R&D infrastructure related to thin film PV using more widely available raw materials should be considered a top priority for the world.

CZTS kesterites are one type of Earth-abundant material system that is garnering increasing interest from the PV community. IBM recently announced a 9.66% conversion efficiency $Cu_2ZnSn(Se,S)_4$ (CTZSS) solar cell. This solar cell used spin coated films from hydrazine-based solutions; however, hydrazine is a known toxin. Also, the cell used cadmium in the CdS buffer layer and a magnesium fluoride anti-reflective coating. While this set of materials may not be desirable for manufacturing, the sharp efficiency improvement over a very short period of time illustrates the potential of CZTS-type materials for PV. Still, there exists a major gap between this proven performance and the theoretical single junction efficiency of 32%.

The immaturity of thin film PV devices exploiting Earth abundant materials represents a daunting challenge in terms of the time-to-commercialization. That same immaturity also suggests an enticing opportunity for breakthrough discoveries. A quaternary system such as CZTS requires management of multiple kinetic pathways, thermodynamic phase equilibrium considerations, defect chemistries, and interfacial control. The vast phase-space to be managed includes process parameters, source material choices, compositions, and overall integration schemes. Traditional R&D methods are ill-equipped to address such complexity, and the traditionally slow pace of R&D could limit any new material from reaching industrial relevance when having to compete with the incrementally improving performance of already established thin film PV fabrication lines.

However, due to the complexity of the material, cell structure and manufacturing process, both the fundamental scientific understanding and large scale manufacturability are yet to be improved for CZTS and CIGS solar cells. As the photovoltaic industry pushes to achieve grid parity, much faster and broader investigation is needed to explore the material, device and process window for higher efficiency and a lower cost of manufacturing process. Efficient methods for forming different types of CZTS solar cells and CIGS solar cells that can be combinatorially varied and evaluated are necessary.

BRIEF DESCRIPTION OF THE DRAWINGS

Various embodiments of the invention are disclosed in the following detailed description and the accompanying drawings.

DETAILED DESCRIPTION

A detailed description of one or more embodiments is provided along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The process of forming solar cell test substrates to combinatorially test materials, processes, and devices is described herein. Combinatorial processing enables multiple experiments to be performed on a single substrate and the rapid evaluation of solar cell processing operations and solar cell materials. The solar cell test substrates are designed to run the different combinatorial processes either in parallel, serial or some combination of serial and parallel. Systems and methods for combinatorial processing are set forth in U.S. Patent App. Pub. No. 2007/0267631 (filed May 18, 2006) and U.S. Pat. No. 7,544,574 (filed Feb. 10, 2006), both of which are hereby incorporated by reference in their entirety. Embodiments of the current invention describe methods of forming different types of CZTS solar cells and CIGS solar cells that can be combinatorially varied and evaluated. These methodologies all incorporate the formation of site-isolated regions using a combinatorial processing tool and the use of these site-isolated regions to form the solar cell area. Therefore, multiple solar cells may be rapidly formed on a single substrate for use in combinatorial methodologies. Any of the individual processes of the methods described may be varied combinatorially to test varied process conditions or materials.

Use of combinatorial-based rapid device prototyping methods permits fabrication, comprehensive characterization, and analysis of hundreds of unique solar cells on a weekly basis to dramatically increase learning rates. Alternative device structures, process integration schemes, and materials compositions are systematically explored at speeds that would otherwise be impossible using traditional methods and tools. This pace of development applied to Earth abundant thin film PV devices may represent an order of magnitude acceleration of R&D in this area.

CZTS is a compound semiconductor that evolves from the chalcopyrite structured I-III-$VI_2$ compound CIGS, where indium/gallium are substituted by zinc/tin and selenium (Se) by sulfur (S). The substituted elements in CZTS are comparatively orders of magnitude more abundant than CIGS elements. CZTS has been reported to have a band gap between 1.45 and 1.6 eV, which is very close to an optimum value of an absorber layer of a solar cell. Additionally, the band edge absorption coefficient of CZTS is above $10^4$ per cm which enables its use as a thin film solar cell absorber candidate. The absorption coefficient is a measure of the fraction of light absorbed by a material per unit of thickness.

Figure 1:
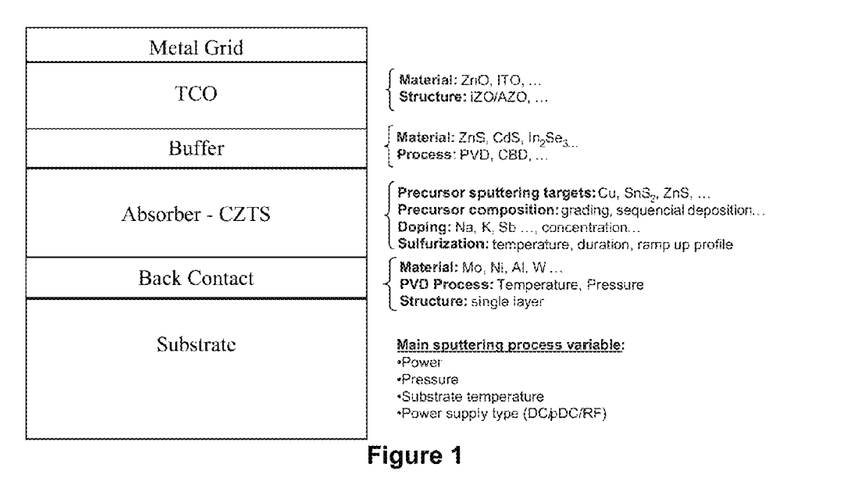
FIG. 1 is a device structure of a CZTS solar cell which includes four primary layers on a substrate.

Referring to FIG. 1, a CZTS device structure may include the deposition of four primary layers on a substrate: a back contact layer (typically Mo), an absorber layer (CZTS), a buffer layer of cadmium sulfide (CdS) or zinc sulfide (ZnS) and a front contact layer of indium tin oxide (ITO) or aluminum zinc oxide (Al:ZnO). Each material and deposition process provides an opportunity to reduce manufacturing costs and increase cell efficiencies. Moreover, the similarity in process flow relative to current CIGS processes offers the intriguing possibility of retrofitting legacy production assets to produce lower cost devices using more environmentally friendly, Earth abundant materials.

Various techniques have been used for depositing the CZTS absorber layer that is the most critical layer in the device stack. These techniques include electron beam deposition followed by sulfurization, hybrid sputtering, vacuum evaporation with sulfurization, sol-gel followed by hydrogen selenide ($H_2Se$) annealing, pulsed laser deposition, sputtering followed by sulfurization, single step radio frequency (RF) sputtering, electroplating, and spray pyrolysis.

Comprised of custom built HPC processing equipment, electrical-test vehicles, characterization suites, and customized software for design-of-experiments and data analysis, each component of the workflow is designed to provide fast and efficient exploration of the materials process space and integration into device structures. HPC systems and methods accelerate each stage of working with a new PV material: discovery, development, optimization, and manufacturing scale-up.

In one embodiment, PVD or sputtering followed by sulfurization and/or sputtering in combination with sulfur containing precursor sources (compound targets) may be used for CZTS deposition. PVD offers a high degree of compositional and uniformity control, and equipment for transferring recipes to mass production is already widely available for glass form factors up to 18 $m^2$. In this embodiment, the incoming glass has a pre-coated back contact layer of Mo. The glass may be cleaned and then loaded to a combinatorial PVD chamber to co-deposit CZTS precursors (e.g., Cu, ZnS and $SnS_2$).

Figure 2:
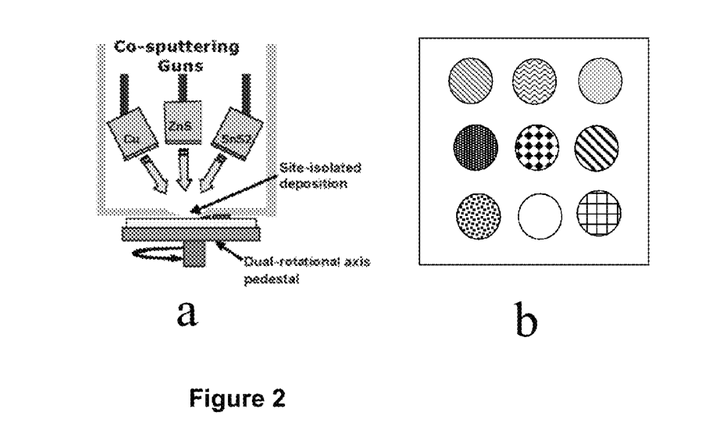
FIG. 2 depicts a) schematic view of CZTS precursor co-sputtering with a HPC PVD chamber (up to 4 sputter sources available), and b) schematic top view of a 5"x5" molybdenum (Mo) coated soda-lime glass (SLG) substrate with site-isolated CIGS/CZTS cells.

FIG. 2 shows an embodiment of a HPC PVD tool and its unique capability to deposit sequenced and simultaneous co-sputtered films under a variety of conditions in a site-isolated manner. A dual rotary stage (FIG. 2a) creates the site-isolation such that thin films can be deposited on a given substrate at user specified locations. Co-sputtering allows a variety of compositions to be deposited using four completely independent sputter sources. The spacing between the substrate and the sputter target of each gun can also be independently controlled. In one embodiment the tool may support four different process gases so that depositions can be done using reactive sputtering. The power sources for the sputter guns can be direct current (DC), pulsed DC, or RF.

In an embodiment, the HPC PVD tool may deposit site-isolated regions without angular artifacts and with excellent within-spot and spot-to-spot uniformities. The site isolated regions may have a diameter in the approximate range of 10 mm to 30 mm. The deposition of the site-isolated regions may create arrays of different complex multi-layer stacks and graded pre-reacted absorber layers can be deposited on a single substrate (FIG. 2b). The result is the ability to rapidly build-up unique CZTS stacks with excellent control over film composition, deposition parameters, and thickness. Consequently, HPC PVD tools can rapidly accelerate the learning needed to tune optimal ternary and quaternary TF PV compositions, regardless of the ultimate deposition method that will be chosen for VLS manufacturing.

In one embodiment, when HPC PVD methodologies are applied to baseline the CIGS thin film system, Cu, CuGa, and In targets in the P-30 tool showed that 1-3 Å/s deposition rates for each material increased linearly with sputtering power. In addition, co-sputtering allowed for the precise control of film stoichiometry within uniform binary and ternary layers for complex stacking experiments. Since co-sputtering provides essentially additive deposition from multiple sources, the deposition rates are likewise essentially additive and in the 3-7 Å/s range. In this embodiment, repeatability was shown to be excellent.

Figure 3:
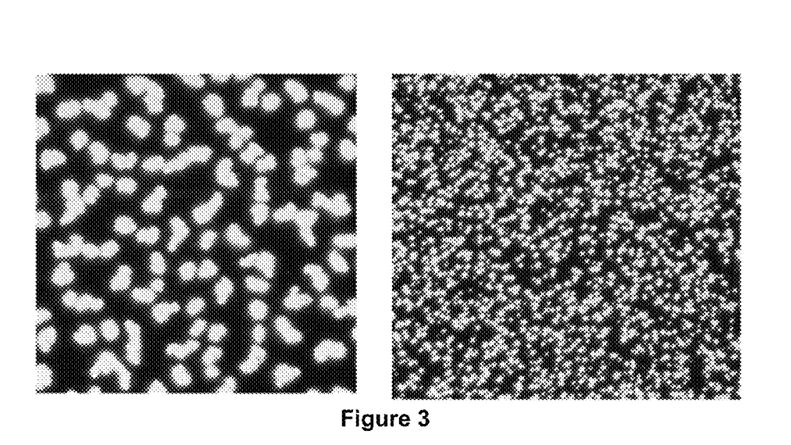
FIG. 3 depicts CIGS/CZTS morphology changes with deposition parameters, as shown in these plan views with equal magnification of two CIGS films deposited on the same Mo back contact layer, where the nominal nodule size is reduced by approximately an order of magnitude.

FIG. 3 shows an example of the large difference in film morphology that can be derived through control of PVD recipe parameters. Cu—In—Ga pre-reacted absorber layer films were deposited under varying conditions in a HPC PVD tool keeping the thickness and composition fixed. The morphology changed dramatically from nominally ~1-10 μm nodule size (left) to an order-of-magnitude reduction in nodule size (right), due only to changes in the PVD recipe. With proper control, the nodule size can be reduced and morphology improved such that AFM measurements show merely 10 nm RMS surface roughness.

Sodium doping, intentionally or indirectly via out-diffusion from the soda lime glass substrate, has been found to boost CIGS efficiency significantly. Fundamental mechanisms are not well understood. Using the HPC PVD chamber, doping studies for CZTS can be systematically and controllably explored using the fourth source.

The cells may be submitted to sulfurization in a high temperature furnace (500-600° C.) in a $H_2S$ gas or S vapor environment. Each cell with unique CZTS precursors on a single substrate with different composition/grading may be subject to the same sulfurization process.

The ability to employ co-sputtering and site-isolation in an HPC workflow may also be applied to the deposition of buffer and front contact layers, enabling rapid build-up of combinatorially unique CZTS photovoltaic cell arrays.

After depositing the metal grid using evaporation or PVD, the cells may be accurately defined with mechanical or laser scribing. Finally the site-isolated solar cells on a single substrate may be characterized in a high-throughput, automated fashion.

The HPC PVD and complementary annealing chambers can be integrated in a cluster tool with an automated front interface, so that a CZTS process flow can be completed without breaking vacuum, which can be advantageous for semiconductor film quality and the solar cell energy conversion efficiency.

Thin film materials such as CZTS appear to offer the potential for abundant and inexpensive PV solar energy generation on the Earth. HPC workflows provide the ability to rapidly and efficiently explore and optimize CZTS materials for integration into a complete solar module. The HPC PVD chambers can be used to deposit back contact layers, CZTS absorbers, buffer layers, and front contact layers. In addition, an annealing chamber for sulfurization/selenization, a laser scriber, and other necessary process/metrology tools are used.

The ongoing goal is to optimize a full CZTS solar cell, requiring the full characterization of the many complex interdependencies within the material/process space. This approach and scale of effort is expected to significantly advance world record efficiencies. More importantly, the combinatorial approach to process windowing and characterization should lead to reduced time to commercialization. A more fundamental understanding of the device and process-dependencies resulting from the HPC workflow will permit procurement of more cost-efficient production tooling, facilitate rapid debugging of pilot lines, and drive faster ramps to VLS production.

Figure 4:
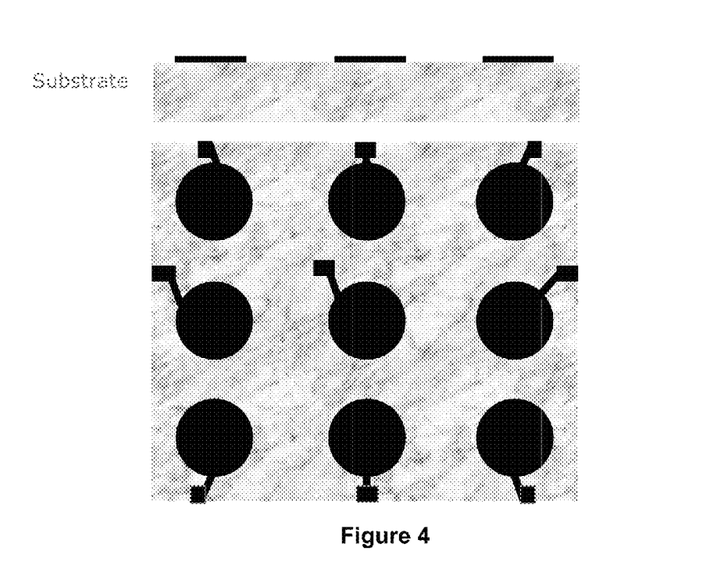
FIG. 4 depicts a substrate coated with a back contact layer such as molybdenum.
Figure 5:
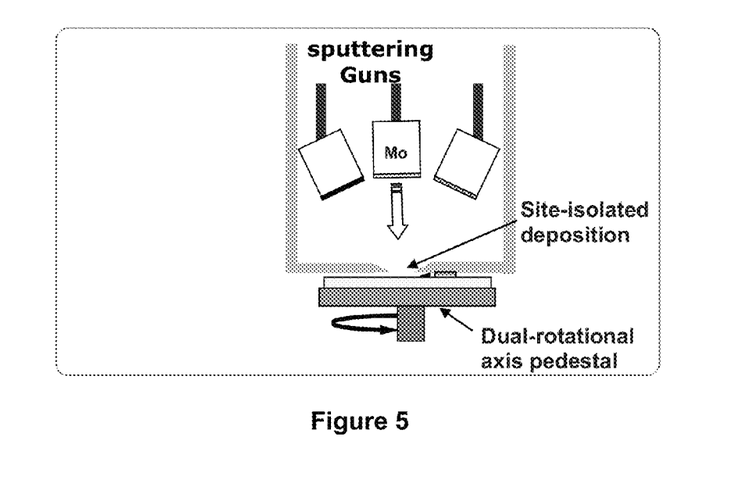
FIG. 5 depicts a High Productivity Combinatorial (HPC) Physical Vapor Deposition (PVD or sputtering) chamber to coat a substrate with Mo.

Embodiments of this invention also use HPC methodology to fabricate CIGS solar cells at an accelerated rate. Embodiments of this invention allow making site-isolated solar cells on a single substrate. A process flow starts with a substrate (either rigid glass or flexible foils such as stainless steel). The substrate may then be coated with a back contact layer such as Mo as shown in FIG. 4. The Mo may be deposited in a HPC PVD chamber as shown in FIG. 5. Different sputtering process conditions such as pressure, power, and substrate temperature can be used for each site-isolated region. As can be seen from FIG. 2, for convenient probing while testing the solar cells, electrode pads can be sputtered through shadow masks while depositing site isolated Mo layer in the same chamber or can be done at once through shadow mask in a single deposition in a different chamber with bigger sputtering area.

Figure 6:
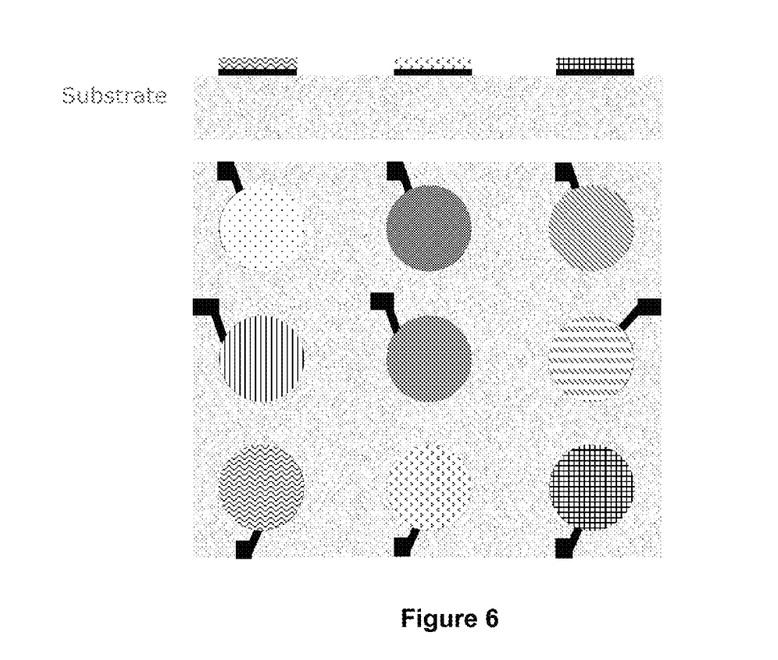
FIG. 6 is the schematic view of a film stack.
Figure 7:
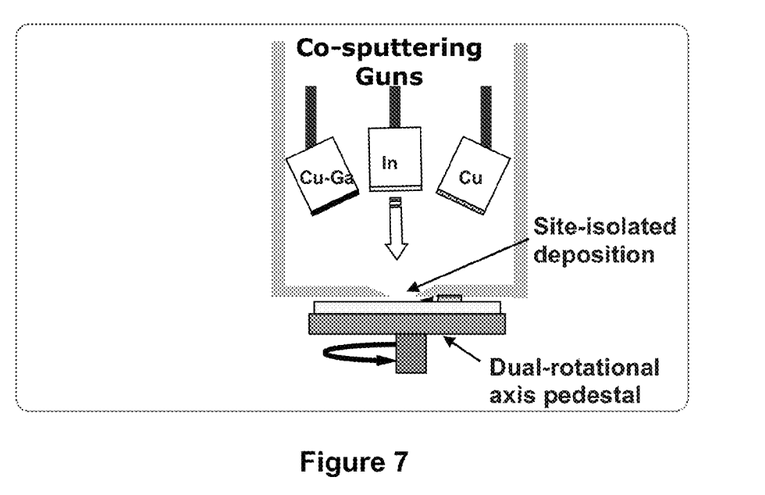
FIG. 7 shows a configuration of the targets using Cu, Cu—Ga and In to co-sputter or sequentially sputter a CIG precursor film that may be selenized in a furnace.

After Mo is deposited, a CIGS absorber layer may be deposited in another sputtering chamber as shown in FIGS. 6-9. FIG. 6 is the schematic view of the film stack. FIG. 7 shows a configuration of the targets using Cu, Cu—Ga and In to co-sputter or sequentially sputter a CIG precursor film that will be selenized in a furnace as discussed later. For sequential sputtering, the layer can be Cu—Ga/In or In/Cu—Ga bilayer, or Cu—Ga/In/Cu—Ga/In/Cu—Ga/In multi-layer, or any other combination of sequence with various elemental compositions.

Figure 8:
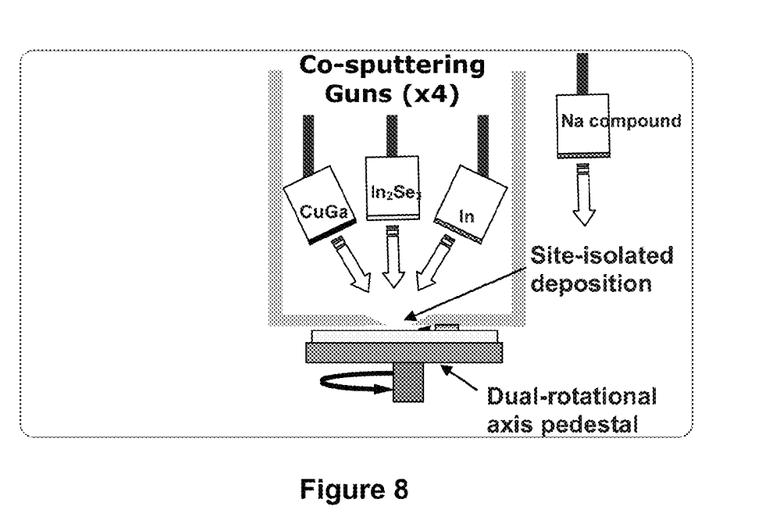
FIG. 8 shows another configuration of using a sodium (Na) compound in the $4^{th}$ target to incorporate Na to the absorber precursor especially in the beginning of the CIGS deposition.
Figure 9:
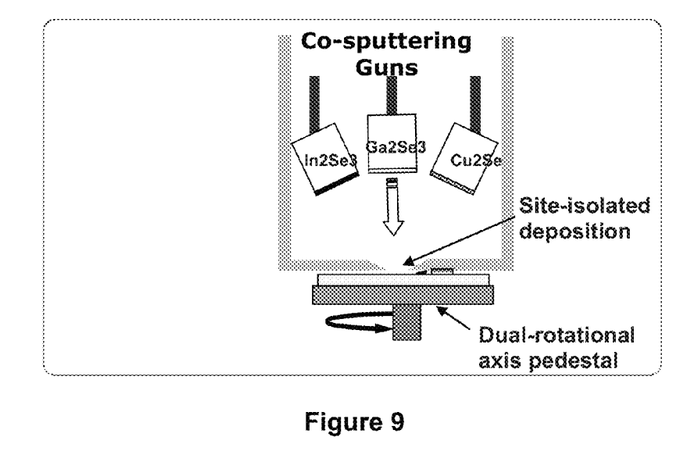
FIG. 9 shows another configuration of the targets using $Cu_2Se$, $In_2Se_3$ and $Ga_2Se_3$ to co-sputter the CIGS film simultaneously.

FIG. 8 shows another configuration of using Na compound in the $4^{th}$ target to incorporate Na to the absorber precursor especially in the beginning of the CIGS deposition. FIG. 9 shows another configuration of the targets using $Cu_2Se$, $In_2Se_3$ and $Ga_2Se_3$ to co-sputter the CIGS film all at once. The resulted film may or may not need selenization after this step to form the CIGS absorber layer. For all the CIG or CIGS deposition described herein, the substrate temperature can vary from room temperature up to 600° C. The alignment between the CIG or CIGS deposition and the previous Mo layer does not require high accuracy. This is because the stack above Mo will be scribed to a smaller area that will be described later.

Figure 10:
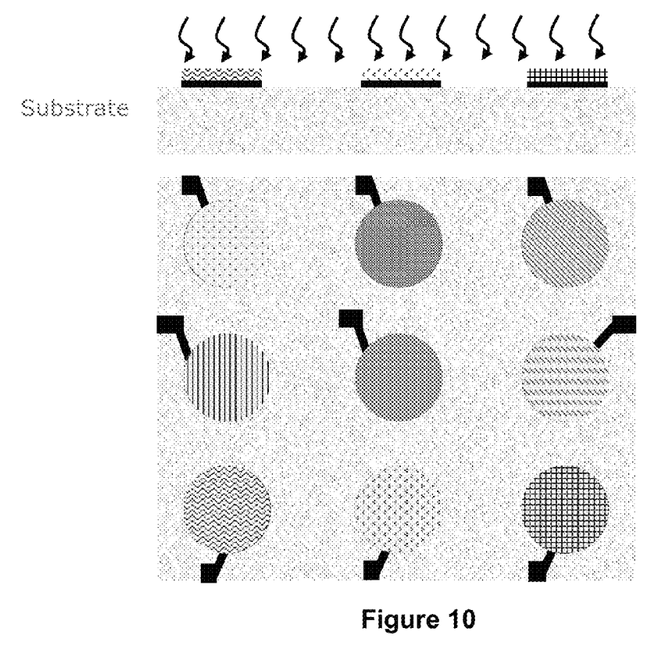
FIG. 10 depicts an exemplary CIGS deposition.

After the CIG precursor deposition and/or the CIGS deposition, as shown in FIG. 10, the film may be selenized in a furnace at elevated temperature in Se-containing environment. $H_2Se$ or Se vapor can be used to selenize the film to desired polycrystalline CIGS film. The temperature can vary between 300 to 600° C. The process can be done with one or two or more steps with temperature profiling.

Figure 11:
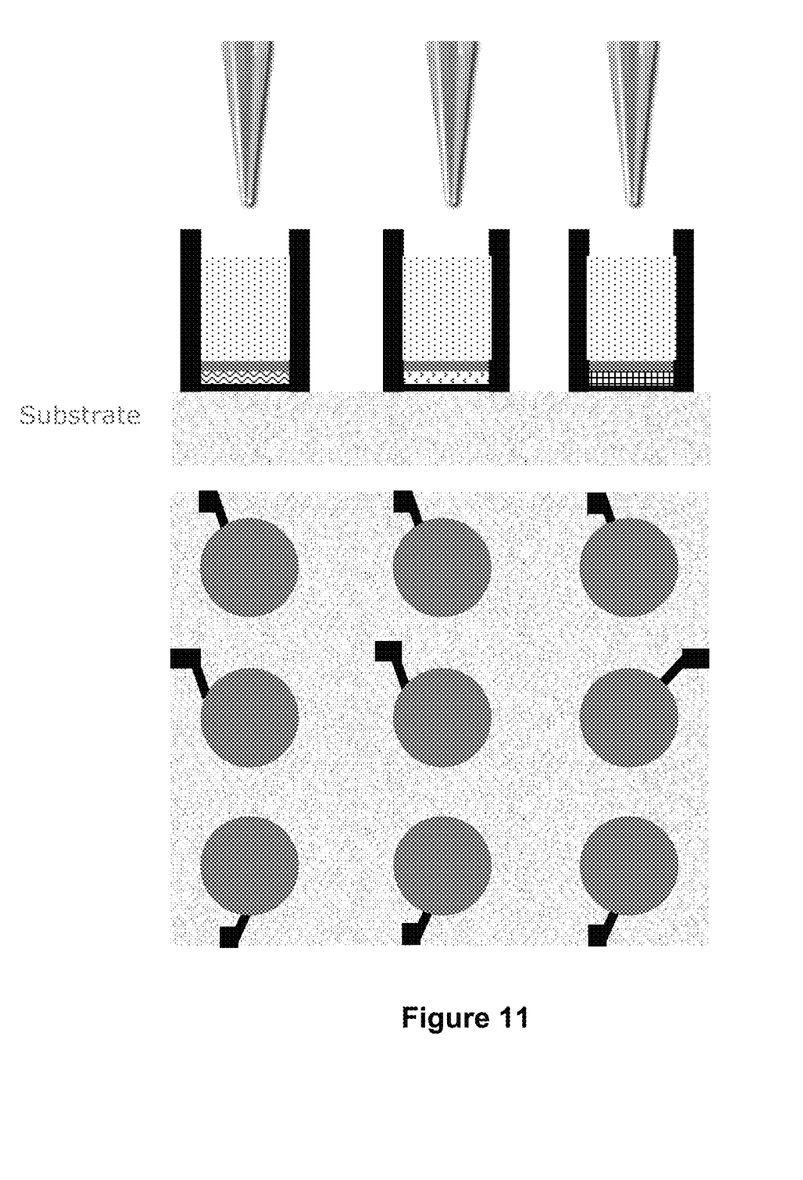
FIG. 11 depicts a site-isolated CBD buffer layer.

A Chemical Bath Deposition (CBD) process may then be applied to the substrate to deposit a thin buffer layer on top of the CIGS absorber. Another HPC apparatus, F20, can be used to deposit site-isolated films as shown in FIG. 11. As mentioned previously the alignment between CdS spots and previous film stack is not critical as mechanical or laser scribing can be used to selectively remove stacks above Mo layer and accurately define the solar cell area.

Figure 12:
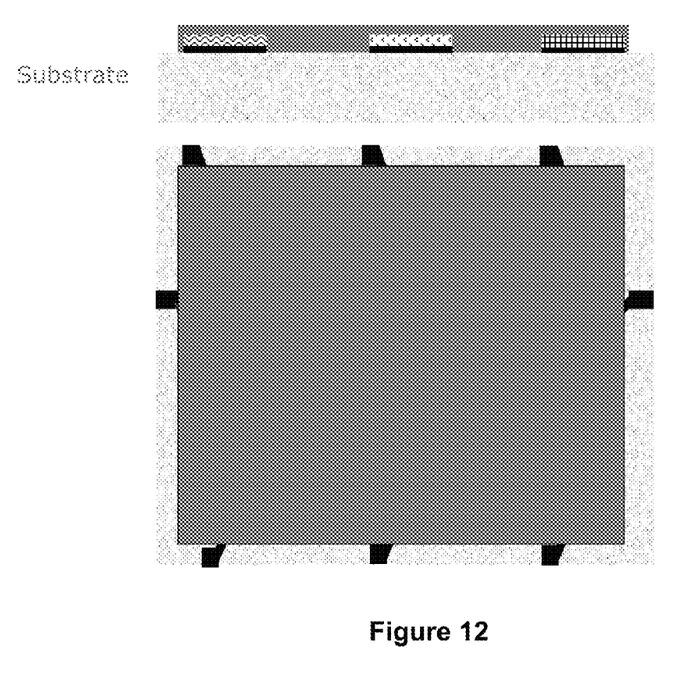
FIG. 12 depicts a full substrate CBD buffer layer.
Figure 13:
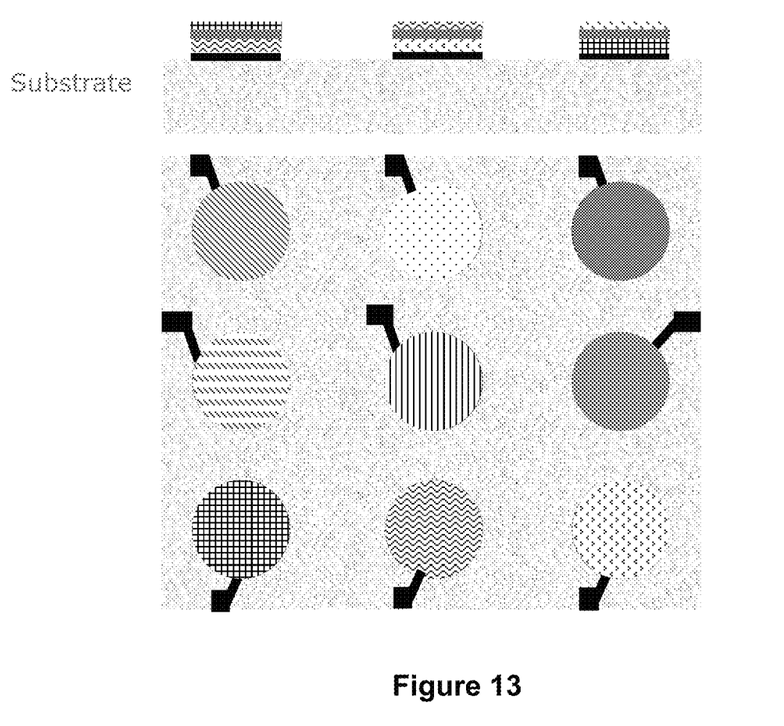
FIG. 13 site-isolated intrinsic zinc oxide (ZnO) window layer deposition.
Figure 14:
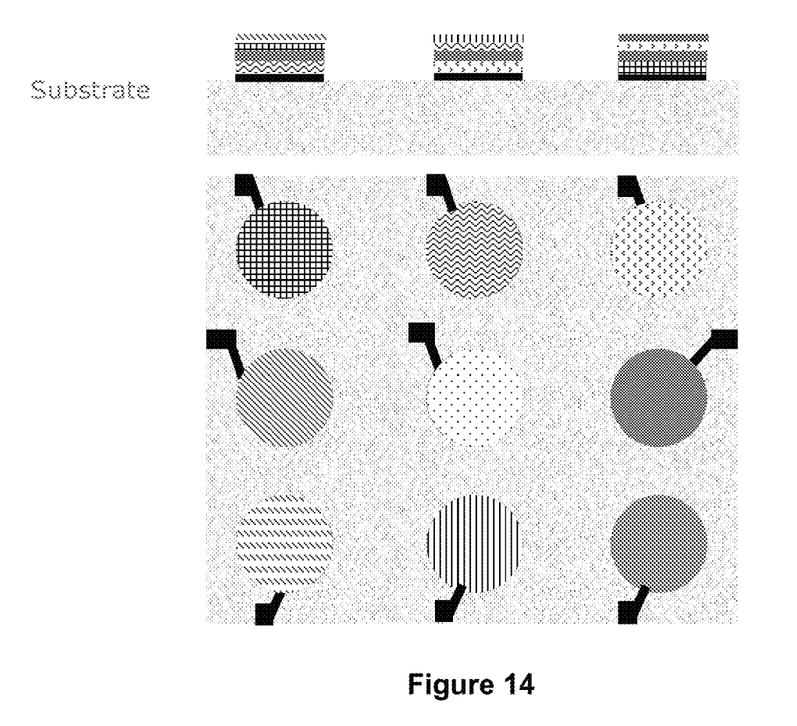
FIG. 14 depicts site-isolated doped ZnO window layer deposition.

Blanket films can also be deposited with normal equipment as shown in FIG. 12. The CdS layer can be removed after this step or at the scribing step to expose the Mo electrode and electrically isolate different spots. Intrinsic ZnO (IZO) and doped ZnO (AZO) can then be sequentially deposited with the same HPC sputtering chamber with site-isolated spots, as shown in FIGS. 13 and 14.

Figure 15:
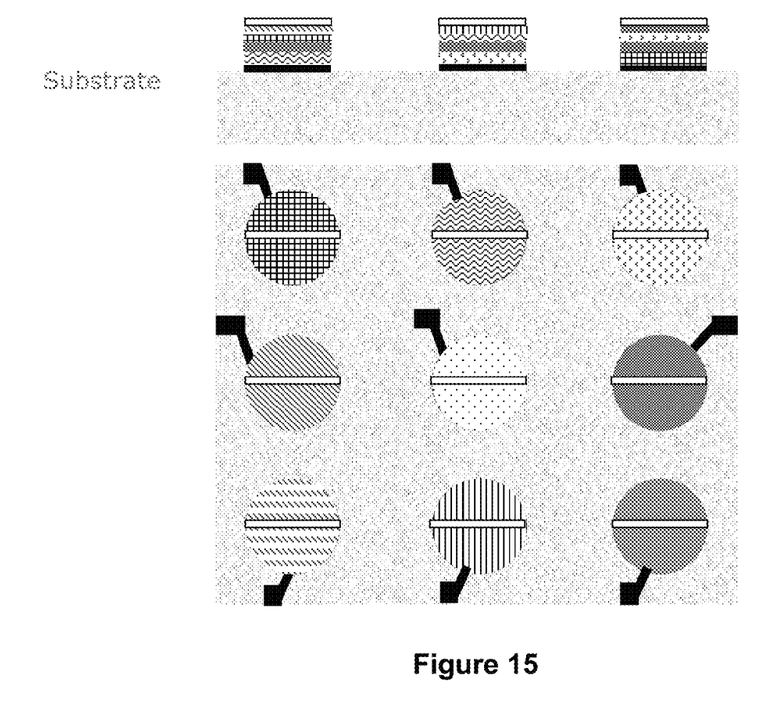
FIG. 15 depicts metal grid deposition.
Figure 16:
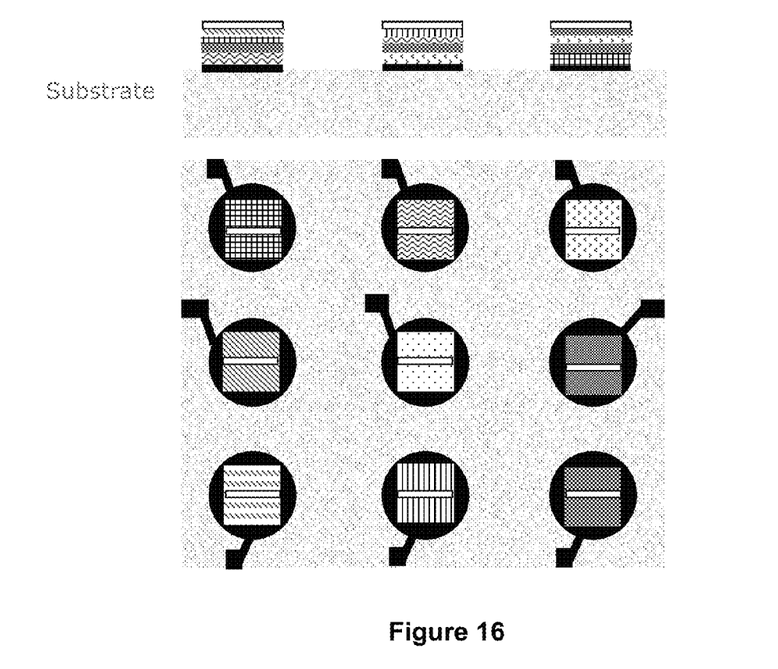
FIG. 16 depicts mechanical/laser scribing to define cell area.
Figure 17:
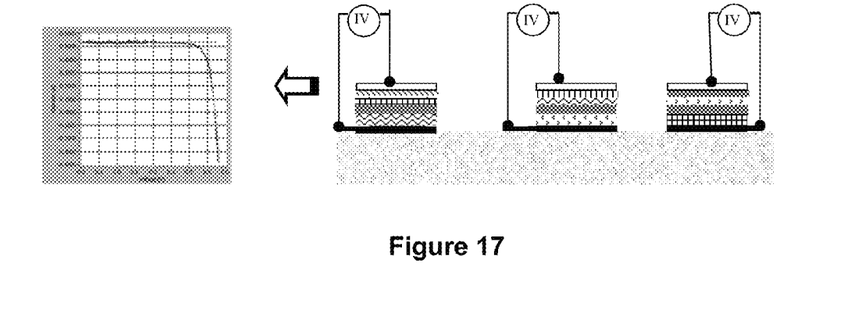
FIG. 17 depicts CIGS site-isolated cell measurement.

As mentioned previously, the alignment of IZO and AZO to previous layers may not be critical. Metal grid of spots can be evaporated or sputtered onto the solar cell stack as shown in FIG. 15. Mechanical or laser scribing can be used to define the cell area as shown in FIG. 16. FIG. 17 shows the measurement of these site-isolated CIGS cells.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method of combinatorially forming a plurality of solar cells on a single substrate, the method comprising:
   depositing one or more back contact layers on the single substrate in a site isolated manner;
   depositing one or more absorber layers on the one or more back contact layers in a site isolated manner,
      wherein the single substrate comprises a plurality of site-isolated processing regions, and
      wherein depositing the one or more absorber layers is performed such that a composition of the one or more absorber layers in a first region of the plurality of site-isolated processing regions is different from a composition of the one or more absorber layers in a second region of the plurality of site-isolated processing regions;
   depositing one or more buffer layers on the one or more absorber layers in a site isolated manner; and
   depositing one or more front contact layers on the one or more buffer layers in a site isolated manner.

2. The method of claim 1, wherein different deposition pressures are employed for depositing the one or more absorber layers in the first region of the plurality of site-isolated processing regions compared to the second region of the plurality of the site-isolated processing regions.

3. The method of claim 1, wherein different deposition powers are employed for depositing the one or more absorber layers in the first one of the plurality of the site-isolated processing regions compared to the second one of the plurality of the site-isolated processing regions.

4. The method of claim 1, wherein different deposition power supply types are employed for depositing the one or more absorber layers in the first region of the plurality of the site-isolated processing regions compared to the second region of the plurality site-isolated processing regions.

5. The method of claim 1, wherein different substrate temperatures are employed for depositing the one or more absorber layers on a first region of the plurality of the site-isolated processing regions compared to a second region of the plurality of the site-isolated processing regions.

6. The method of claim 1, further comprising depositing one or more electrode pads connected to the one or more back contact layers.

7. The method of claim 1, wherein the one or more absorber layers are deposited by physical vapor deposition.

8. The method of claim 1, wherein the one or more buffer layers are deposited by chemical bath deposition.

9. The method of claim 1, further comprising doping at least one of the one or more absorber layers with a dopant.

10. The method of claim 1, further comprising sulfurizing each of the one or more absorber layers.

11. The method of claim 1, further comprising selenizing each of the one or more absorber layers.

12. A method of combinatorially forming a plurality of solar cells on a single substrate, the method comprising:
   depositing one or more back contact layers on the substrate in a site isolated manner, wherein the one or more back contact layers comprise molybdenum;
   depositing one or more absorber layers on the one or more back contact layers in a site isolated manner, wherein the one or more absorber layers comprises CZTS,
      wherein the single substrate comprises a plurality of site-isolated processing regions, and
      wherein depositing the one or more absorber layers is performed such that a composition of the one or more absorber layers in a first region of the plurality of site-isolated processing regions is different from a composition of the one or more absorber layers in a second region of the plurality of site-isolated processing regions;
   depositing one or more buffer layers on the one or more absorber layers in a site isolated manner, wherein the one or more buffer layers comprise one of CdS or ZnS; and
   depositing one or more front contact layers on the one or more buffer layers in a site isolated manner, wherein the one or more front contact layers comprise one of ITO or Al:ZnO.

13. The method of claim 12, wherein depositing the one or more absorber layers comprises substantially simultaneously depositing copper, zinc sulfide and tin sulfide.

14. The method of claim 12, further comprising doping at least one of the one or more absorber layers with a dopant.

15. The method of claim 14, wherein the dopant comprises one of sodium, potassium and antimony.

16. The method of claim 12, further comprising sulfurizing each of the one or more absorber layers.

17. A method of combinatorially forming a plurality of solar cells on a single substrate, the method comprising:
   depositing one or more back contact layers on the substrate in a site isolated manner;
   depositing one or more absorber layers on the one or more back contact layers in a site isolated manner,
      wherein the one or more absorber layers comprise CIGS,
      wherein the single substrate comprises a plurality of site-isolated processing regions, and
      wherein depositing the one or more absorber layers is performed such that a composition of the one or more absorber layers in a first region of the plurality of site-isolated processing regions is different from a composition of the one or more absorber layers in a second region of the plurality of site-isolated processing regions;

depositing one or more buffer layers on the one or more absorber layers in a site isolated manner,
wherein the one or more buffer layers comprise one of CdS, ZnS or In2Se3; and depositing one or more front contact layers on the one or more buffer layers in a site isolated manner, wherein the one or more front contact layers comprise one of ITO or AlZnO.

18. The method of claim 17, wherein depositing the one or more absorber layers comprises substantially simultaneously depositing copper, gallium and indium.

19. The method of claim 17, further comprising doping at least one of the one or more absorber layers with a dopant.

20. The method of claim 19, wherein the dopant comprises one of sodium, potassium and antimony.

21. The method of claim 17, further comprising selenizing each of the one or more absorber layers.

\* \* \* \* \*